(12) United States Patent
Lee

(10) Patent No.: US 11,616,074 B2
(45) Date of Patent: Mar. 28, 2023

(54) SEMICONDUCTOR DEVICE AND MANUFACTURING METHOD OF THE SAME

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/859,157

(22) Filed: Apr. 27, 2020

(65) Prior Publication Data

US 2020/0258907 A1 Aug. 13, 2020

Related U.S. Application Data

(63) Continuation of application No. 15/019,728, filed on Feb. 9, 2016, now Pat. No. 10,672,786.

(30) Foreign Application Priority Data

Sep. 2, 2015 (KR) .......................... 10-2015-0124370

(51) Int. Cl.
| | | |
|---|---|---|
| *H01L 27/11563* | (2017.01) | |
| *H01L 27/11578* | (2017.01) | |
| *H01L 27/11582* | (2017.01) | |
| *H01L 27/11556* | (2017.01) | |
| *H01L 29/792* | (2006.01) | |

(Continued)

(52) U.S. Cl.
CPC .. *H01L 27/11582* (2013.01); *H01L 27/11556* (2013.01); *H01L 27/1157* (2013.01); *H01L 29/66833* (2013.01); *H01L 29/792* (2013.01)

(58) Field of Classification Search
CPC .............. G11C 16/0483; G11C 17/123; G11C 2213/75; H01L 27/11524; H01L 27/11529; H01L 27/1157; H01L 27/11582; H01L 27/11578; H01L 27/11551; H01L 27/11556; H01L 27/11521; H01L 29/7926; H01L 21/28282
See application file for complete search history.

(56) References Cited

U.S. PATENT DOCUMENTS

| | | | |
|---|---|---|---|
| 8,247,863 B2 * | 8/2012 | Fukuzumi ........... | H01L 29/7926 257/324 |
| 8,987,908 B2 * | 3/2015 | Lee .................... | H01L 27/11551 257/758 |
| 9,245,962 B1 * | 1/2016 | Yang ................. | H01L 27/11578 |

(Continued)

OTHER PUBLICATIONS

Office Action issued by China National Intellectual Property Administration dated Aug. 27, 2020.

*Primary Examiner* — Mary A Wilczewski
*Assistant Examiner* — Tsz K Chiu
(74) *Attorney, Agent, or Firm* — IP & T Group LLP

(57) ABSTRACT

The present disclosure provides a semiconductor device comprising: a block separator including a semiconductor film and a multi-layered insulating film, wherein the multi-layered insulating film surrounds the semiconductor film; memory block stacks divided from each other by the block separator, each memory block stack including interlayer insulating films and conductive patterns alternately stacked, wherein the conductive patterns are coupled to memory cells; and channel structures passing through the memory block stacks and electrically coupled to the memory cells.

19 Claims, 12 Drawing Sheets

(51) Int. Cl.
*H01L 29/66* (2006.01)
*H01L 27/1157* (2017.01)

(56) References Cited

U.S. PATENT DOCUMENTS

| | | | |
|---|---|---|---|
| 9,698,153 B2* | 7/2017 | Liu | H01L 27/11524 |
| 2011/0024818 A1* | 2/2011 | Ahn | H01L 29/7881 |
| | | | 257/314 |
| 2012/0098050 A1* | 4/2012 | Shim | H01L 27/11578 |
| | | | 257/E29.262 |
| 2012/0126308 A1* | 5/2012 | Kim | H01L 27/1157 |
| | | | 257/324 |
| 2013/0100741 A1 | 4/2013 | Choi et al. | |
| 2013/0215684 A1* | 8/2013 | Oh | H01L 27/11573 |
| | | | 257/314 |
| 2014/0103417 A1* | 4/2014 | Lee | H01L 29/792 |
| | | | 257/324 |
| 2015/0236038 A1* | 8/2015 | Pachamuthu | H01L 27/11524 |
| | | | 257/326 |
| 2015/0263037 A1* | 9/2015 | Noda | H01L 27/11582 |
| | | | 257/314 |
| 2016/0307917 A1* | 10/2016 | Yada | H01L 29/4966 |
| 2016/0322381 A1* | 11/2016 | Liu | H01L 29/40114 |
| 2021/0028186 A1* | 1/2021 | Lim | H01L 29/513 |

\* cited by examiner

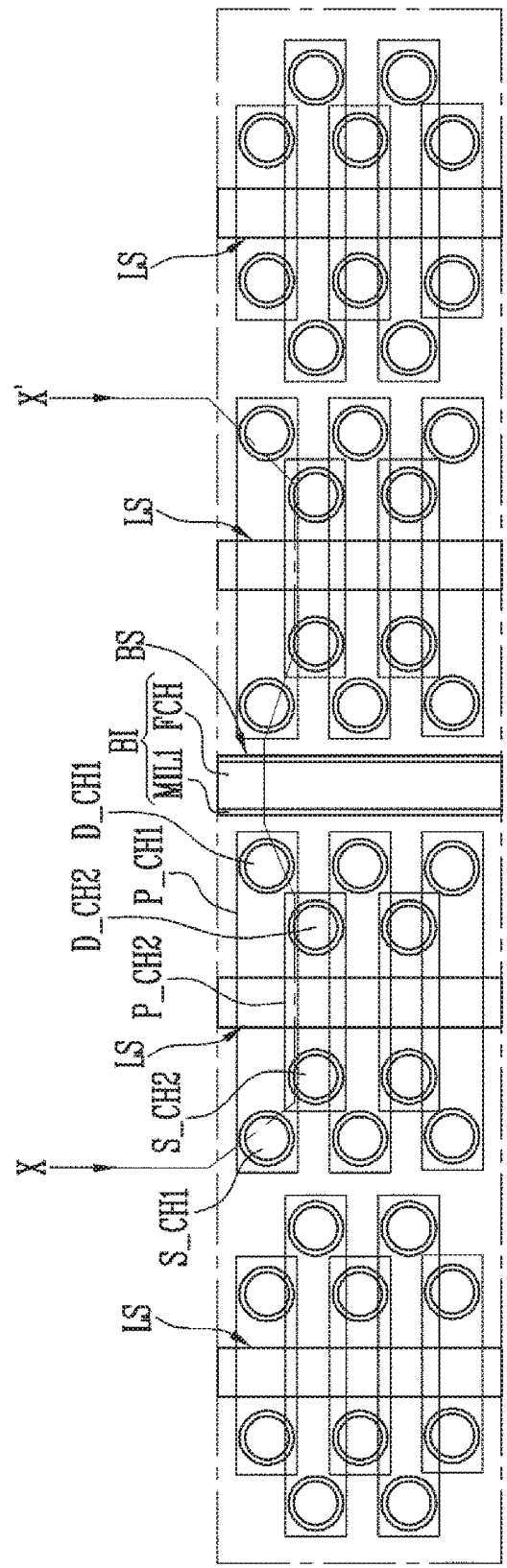

SEMICONDUCTOR DEVICE AND MANUFACTURING METHOD OF THE SAME

CROSS-REFERENCE TO RELATED APPLICATION

This application is a continuation of U.S. patent application Ser. No. 15/019,728 filed on Feb. 9, 2016, which claims benefits of priority of Korean Patent Application No. 10-2015-0124370 filed on Sep. 2, 2015. The disclosure of each of the foregoing application is incorporated herein by reference in its entirety by reference.

BACKGROUND

1. Field

The present disclosure relates to a semiconductor device and a method of manufacturing the same, and, in particular, a semiconductor device including a three-dimensional arrangement of memory cells and a method of manufacturing the same.

2. Description of the Related Art

The semiconductor device may include memory blocks. The memory blocks each may include memory cells to store data therein. To improve an integration of the memory cells, the memory cells may have a three-dimensional arrangement. In this regard, a memory block stack may include alternating vertical interlayer insulating films and conductive patterns. Additionally, the memory cells are respectively connected to the conductive patterns.

To improve an integration of the memory cells forming the memory block stack, the memory block stack may have an increased number of alternating vertical interlayer insulating films and conductive patterns. In this case, there is a need for a stable division for the memory block stacks as a height of the stack increases.

SUMMARY

The present disclosure may provide a semiconductor device and a method of manufacturing the same. Memory block stacks included in the semiconductor device have an enhanced integration and are divided in a stable manner.

In one aspect of the present disclosure, there is provided a semiconductor device comprising: a block separator including a semiconductor film and a multi-layered insulating film, wherein the multi-layered insulating film surrounds the semiconductor film; memory block stacks divided from each other by the block separator, each memory block stack including interlayer insulating films and conductive patterns alternately stacked, wherein the conductive patterns are coupled to memory cells; and channel structures passing through the memory block stacks and electrically coupled to the memory cells.

In one aspect of the present disclosure, there is provided a method of manufacturing a semiconductor device, comprising: forming a first vertical stack including first material films and second material films alternately stacked, wherein the first vertical stack is divided by a first protection pattern into memory blocks and surrounds second protection patterns; forming a second vertical stack including third material films and fourth material films alternately stacked on the first vertical stack, wherein the second vertical stack is divided by an upper block slit into the memory blocks, wherein the upper block slit vertically passes through the second vertical stack to expose the first protection pattern, wherein upper channel holes pass through the second vertical stack to expose the second protection patterns; removing the first protection pattern and the second protection patterns through the upper block slit and the upper channel holes to form a first space and second spaces, respectively; filling the upper block slit and the first space to form a block separator; and filling the upper channel holes and the second spaces to form channel structures, wherein filling the upper block slit and the first space, and filling the upper channel holes and the second spaces, are performed substantially at the same time.

DETAILED DESCRIPTIONS

Figure 1A:
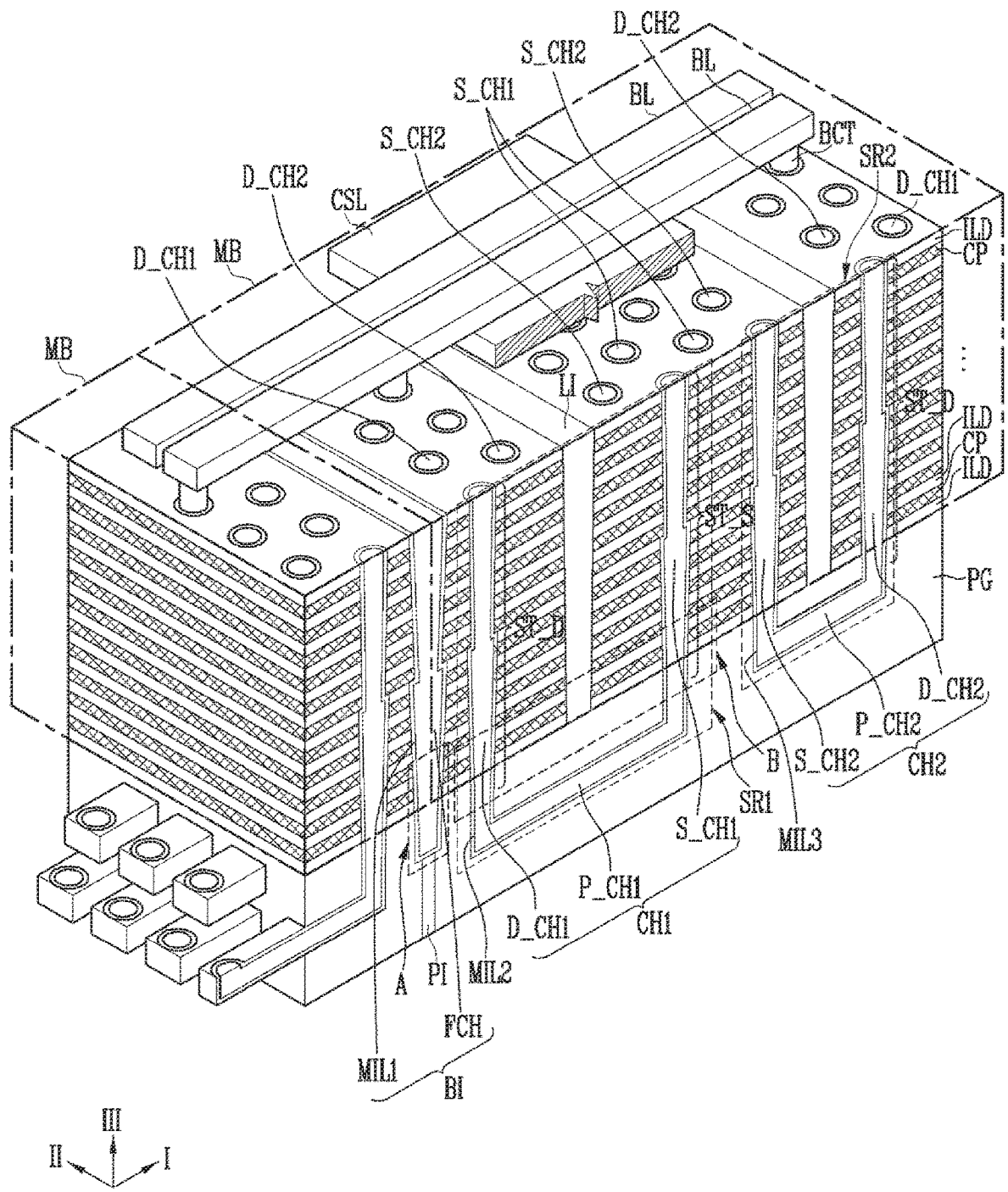
FIG. 1A to FIG. 1C respectively illustrate a semiconductor device in accordance with an embodiment of the present disclosure.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in detail with reference to attached drawings.

Figure 1B:
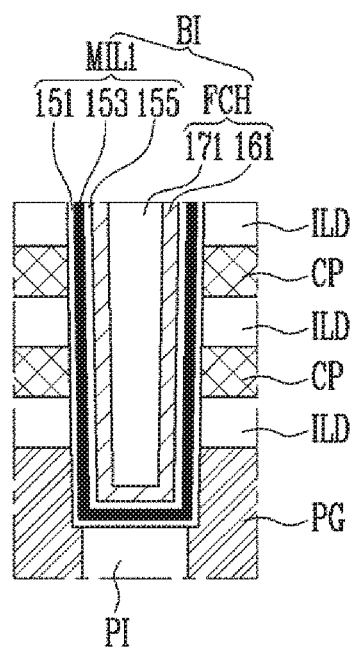
Figure 1C:
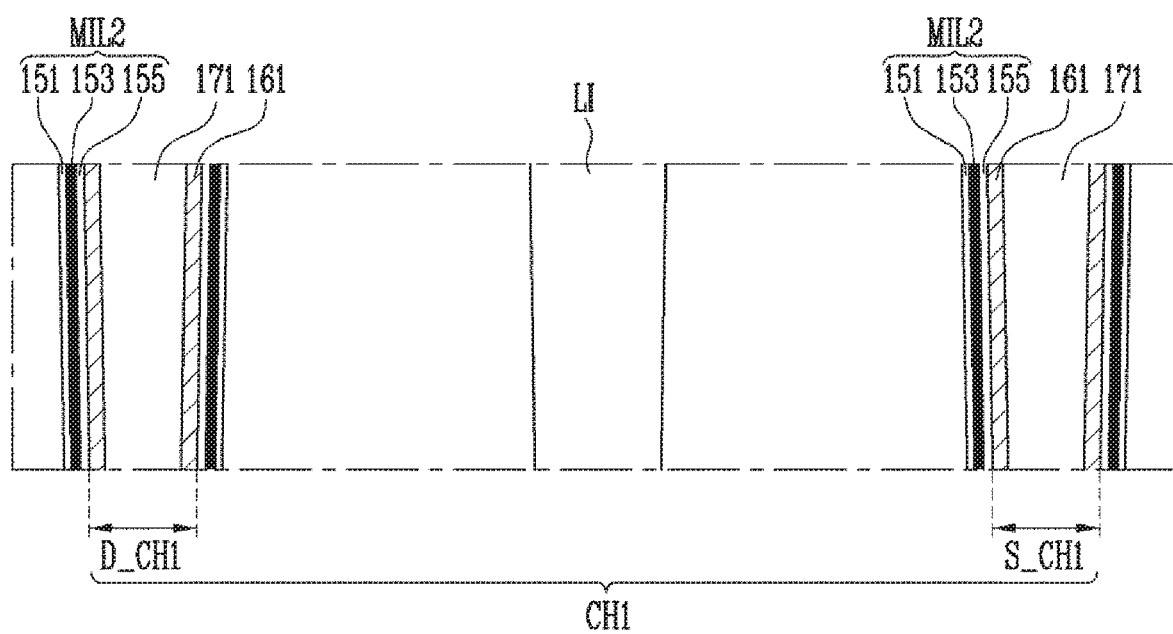

FIG. 1A to FIG. 1C respectively illustrate a semiconductor device in accordance with one embodiment of the present disclosure. More specifically, FIG. 1A is a perspective view of a semiconductor device in accordance with one embodiment of the present disclosure. FIG. 1B is an enlarged cross-sectional view of the "A" region in FIG. 1A. FIG. 1C is an enlarged cross-sectional view of the "B" region in FIG. 1A.

Referring to FIG. 1A, the semiconductor device in accordance with one embodiment of the present disclosure may include memory block stacks MB and a pipe gate PG disposed below the memory block stacks MB. Each memory block stack MB and the pipe gate PG may be passed through by channel structures CH1, CH2.

Each of the memory block stacks MB may include a vertical alteration of interlayer insulating films ILD and conductive patterns CR Two neighboring memory block stacks MB may be separated from each other via a block separator BI. The block separator BI may include a first multi-layered insulating film MIL1 and a floating channel structure FCH surrounded with the first multi-layered insulating film MIL1. The first multi-layered insulating film MIL1 may include a stack of first, second, and third films. The first film may include the same material as a tunnel insulating film. The second film may include the same material as a data storage film. The third film may include the same material as a blocking insulating film. The first multi-layered insulating film MIL1 and the floating channel structure FCH are described in detail below with reference to FIG. 1B.

A line divider LI vertically passes through the interlayer insulating films ILD and conductive patterns CP of each of the memory block stacks MB. The line divider LI may define a layout of the interlayer insulating films ILD and conductive patterns CP of each of the memory block stacks MB. The line divider LI may divide the interlayer insulating films ILD and conductive patterns CP of each of the memory block stacks MB into a source-side stack ST_S and a drain-side stack ST_D.

The line divider LI may be different in configuration from the block separator BI. The block separator BI may include a larger number of films than the line divider LI. More specifically, the block separator BI may include multi-layered films. The line divider LI may be made of a single insulating material. In one example, the line divider LI may be made of an oxide film.

A pipe gate PG may be disposed below the source-side stack ST_S, the drain-side stack ST_D and the line divider LI. A pipe division insulating film PI may vertically pass through the pipe gate PG. The pipe division insulating film PT may be designed to have the same layout as the block separator BI so as to divide the pipe gate PG on the memory block basis. The pipe division insulating film PI may be disposed beneath the block separator BI. In other words, the block separator BI may overlap with the pipe division insulating film PI.

The channel structures CH1, CH2 each may be made of the same material film as the floating channel structure FCH of the block separator BI. The material about the channel structures CH1, CH2 and floating channel structure FCH may be described below with reference to FIG. 1B and FIG. 1C. The channel structures CHI, CH2 each may be surrounded with a second multi-layered insulating film MIL2 or a third multi-layered insulating film MIL3. Each of the second and third multi-layered insulating films MIL2 and MIL3 may include a data storage film and may be made of the same material film as the first multi-layered insulating film MIL1 The material about the second and third multi-layered insulating films MIL2 and MIL3 may be described later with reference to FIG. 1C.

Each of the channel structures CHI, CH2 may connect in a series the memory cells and the select transistor to form a memory string SR1 or SR2. The channel structures CH1, CH2 may include the first channel structure CH1 and the second channel structure CH2.

The first channel structure CH1 may include a first pipe channel P_CHL the first source-side pillar S_CH1, and the first drain-side pillar D_CH1. The first pipe channel P_CH1 may be embedded in the pipe gate PG. The first source-side pillar S_CH1 may extend from the first pipe channel P_CH1 and then extend upwardly through the pipe gate PG and source-side stack ST_S. The first drain-side pillar D_CH1 may extend from the first pipe channel P_CH1 and then extend upwardly through the pipe gate PG and drain-side stack ST_D.

The second channel structure CH2 may include a second pipe channel P_CH2, a second source-side pillar S_CH2, and a second drain-side pillar D_CH2. The second pipe channel P_CH2 may be buried in the pipe gate PG. The second source-side pillar S_CH2 may extend from the second pipe channel P_CH2 and then upwardly through the pipe gate PG and source-side stack ST_S. The second drain-side pillar D_CH2 may extend from the first pipe channel P_CH2 and then upwardly though the pipe gate PG and drain-side stack ST_D.

The first pipe channels P_CH1 and the second pipe channels P_CH2 may be disposed below a single memory block stack MB. The first pipe channels P_CH1 and the second pipe channels P_CH2 may be arranged within a single region corresponding to the single memory block stack MB. Each of the first pipe channels P_CH1 and the second pipe channels P_CH2 in the single region may be arranged alternately in a first direction I. The first pipe channels P_CH1 and the second pipe channels P_CH2 in the single region may be arranged alternately in a second direction II.

The first and second directions I and II may perpendicularly cross each other. The first direction I may correspond to an extension direction of a bit line BL as will be described later. The second direction II may correspond to an extension direction of the line division insulating film LI.

The second pipe channel P_CH2 may be disposed at a higher level than the first pipe channel P_CH1. The second pipe channel P_CH2 may have a smaller horizontal length in the first direction I than the first pipe channel P_CH1. In this way, the adjacent first pipe channel P_CH1 and second pipe channel P_CH2 in the second direction II may spatially overlap, and a length of the first pipe channel P_CH1 which is measured along the first direction I is longer than a length of the second pipe channel P_CH2 which is measured along the first direction I. Moreover, the second source-side pillar S_CH2 and the second drain-side pillar D_CH2 respectively vertically extend from both ends of the second pipe channel P_CH2. Likewise, the first source-side pillar S_CH1 and the first drain-side pillar D_CH1 respectively vertically extend from both ends of the first pipe channel P_CH1.

In this approach, the first and second pipe channels P_CH1 and P_CH2 may be disposed in a compact manner, leading to an improvement in integration of the memory device.

The conductive patterns CP of the source-side stack ST_S may include a source-side word line coupled to a source-side memory cell and a source select line coupled to a source select transistor. The source select line may be a single layer or a multi-layer. The source-side word line may be a multi-layer.

The conductive patterns CP of the drain-side stack ST_D may include a drain-side word line coupled to a drain-side memory cell and a drain select line coupled to a drain select transistor. The drain select line may be a single layer or a multi-layer. The drain-side word line may be a multi-layer. The pipe gate PG may be coupled to a pipe transistor.

The first channel structure CH1 may electrically connect in a series the drain select transistor, the multiple of the drain-side memory cells, the pipe transistor, the multiple of the source-side memory cells, and the source select transistor to define the first the memory string SR1. The second channel structure CH2 may electrically connect in a series the drain select transistor, the multiple of the drain-side memory cells, the pipe transistor, the multiple of the source-side memory cells, and the source select transistor to define the second the memory string SR2.

Since the first pipe channel P_CH1 and the second pipe channel P_CH2 may be disposed in a compact way, the first the memory string SR1 and the second the memory string SR2 may also be disposed in a compact way. In this way, the present disclosure may, in one embodiment, increase an integration of the memory device in a given space. In another embodiment, the second memory string SR2, which is formed along the second channel film CH2, may be omitted. Hereinafter, for a sake of convenience of illustration, an embodiment includes both of the first and second the memory strings SR1, SR2. However, the present disclosure may not be limited thereto.

The first the memory string SR1 and the second the memory string SR2 each may be disposed between common source line CSL and bit line BL. The first the memory string SR1 and the second the memory string SR2 each may be connected to a common source line CSL and bit line BL. More specifically, the first and second source-side pillars S_CH1 and S_CH2 may be coupled to the common source line CSL disposed on the memory block stacks MB. The first and second drain-side pillars D_CH1 and D_CH2 may be coupled to the bit line BL disposed on the memory block stacks MB. Each of the bit line BL and common source line CSL may be made of a conductive material. The bit line BL may be disposed over and be spaced from the common source line CSL. In this case, the bit line BL may be coupled via bit line contact plugs BCT extending in a third direction II to the first and second drain-side pillars D_CH1 and D_CH2. The third direction III may correspond to a stacking direction of the conductive patterns CP and interlayer insulating films ILD and may be perpendicular to a plane defined by the first direction I and the second direction II.

Referring to FIG. 1B, the block separator BI may include the floating channel structure FCH and the first multi-layered insulating film MIL1 surrounding the floating channel structure FCH. The block separator BI may be disposed on the pipe division insulating film PI which may divide the pipe gate PG on the memory block basis. The block separator BI may divide the vertical alternation of the interlayer insulating films ILD and conductive patterns CP on the memory block basis.

The first multi-layered insulating film MIL1 may be made of the same material film as the second and third multi-layered insulating films MIL2, MIL3. The second and third multi-layered insulating films MIL2, MIL3 may surround respectively the channel structures (CH1, CH2 in FIG. 1A) in order to implement the memory cells of the memory strings SR1, SR2 respectively as shown in FIG. 1A. More specifically, the first multi-layered insulating film MIL1 may include a tunnel insulating film 155 surrounding the floating channel structure FCH, a data storage film 153 surrounding the tunnel insulating film 155, and a blocking insulating film 151 surrounding the data storage film 153.

The tunnel insulating film 155 may be made of an insulating material with a charge tunneling capability. In one example, the tunnel insulating film 155 may be made of a silicon oxide film. The data storage film 153 may be made of a material film with a charge trapping capability. In one example, the data storage film 153 may be made of a silicon nitride film. The blocking insulating film 151 may be made of an insulating material with a charge blocking capability. In one example, the blocking insulating film 151 may include a silicon oxide film or a dielectric film having a higher dielectric constant than the silicon oxide film.

The floating channel structure FCH may be made of the same material film as the channel structures (CH1, CH2 in FIG. 1A) which implement respectively the memory cells of the memory strings SR1, SR2 as shown in FIG. 1A. More specifically, the floating channel structure FCH may include a semiconductor film 161 surrounded with the first multi-layered insulating film MIL1 The semiconductor film 161 may include a silicon film. When the semiconductor film 161 is formed along a border of the floating channel structure FCH, the floating channel structure FCH may further include a core insulating film 171 surrounded with the semiconductor film 161. When the core insulating film 171 has a smaller height than the semiconductor film 161, the floating channel structure FCH may further include a capping conductive film. The capping conductive film may be disposed on the core insulating film 171 and be in a contact with the semiconductor film 161. The capping conductive film may be described more specifically below in connection to FIG. 7B.

The semiconductor film 161 and capping conductive film of the floating channel structure FCH may not be connected to any signal lines so that they may be in an electrically floating state during an operation of the memory strings SR1, SR2 including the memory cells. Further, the floating channel structure FCH may be insulated from the conductive patterns CP via the first multi-layered insulating film MIL. In this way, the block separator BI including the floating channel structure FCH may electrically separate the memory blocks MB from each other.

Referring to FIG. 1C, the first channel structure CH1 in FIG. 1A may be surrounded with the second multi-layered insulating film MIL2. More specifically, the second multi-layered insulating film MIL2 may be formed on and along outer-walls of the first drain-side pillar D_CH1, the first source-side pillar S_CH1, and the first pipe channel P_CH1. The second multi-layered insulating film MIL2 may include a tunnel insulating film 155 surrounding the first channel structure CH1, a data storage film 153 surrounding a tunnel insulating film 155, and a blocking insulating film 151 surrounding the data storage film 153. The tunnel insulating film 155, data storage film 153, and blocking insulating film 151 may have respective properties as mentioned above in connection to FIG. 1B.

The first channel structure CH1 including the first drain-side pillar D_CH1, the first source-side pillar S_CH1, and the first pipe channel P_CH1 may be made of the same material film as the floating channel structure FCH as mentioned above in connection to FIG. 1B. More specifically, the first channel structure CH1 may include the semiconductor film 161 surrounded with the second multi-layered insulating film MIL2. The semiconductor film 161 may include a silicon film. When the semiconductor film 161 is formed along a border of the first channel structure CH1, the first channel structure CH1 may further include a core insulating film 171 surrounded with the semiconductor film 161.

When the core insulating film 171 has a smaller height than the semiconductor film 161, each of the first drain-side pillar D_CH1 and the first source-side pillar S_CH1 may further include a capping conductive film. The capping conductive film may be formed on the core insulating film 171 and be in a contact with the semiconductor film 161. The capping conductive film will be later described more specifically with reference to FIG. 7B.

Although not shown in the figure, the third multi-layered insulating film MIL3 in FIG. 1A may include the same material film as the second multi-layered insulating film MIL2, and the second channel structure CH2 may include the same material film as the first channel structure CH1. The line division insulating film LI may be made of a single insulating material.

As addressed above, the present disclosure, in one embodiment, may form the block separator BI. The block separator BI may be formed of the same materials as the channel structures CH1, CH2 and the multi-layered insulating films MIL2 and MIL3 which respectively surround the channel structures CH1, CH2. Therefore, the present disclosure, in one embodiment, may control a manufacturing process for the semiconductor device so as to improve the manufacturing process stability and reduce a stress level created from the manufacturing process.

Hereinafter, with reference to FIG. 2A to FIG. 9, a manufacturing process for the semiconductor device in accordance with one embodiment of the present disclosure will be more specifically described. For the reference, FIG. 2B, FIG. 3 to FIG. 6, FIG. 7A, FIG. 8B, FIG. 9 are cross-sectional views of partially-manufactured semiconductor devices at respective stages and are taken along a line "X-X" in FIG. 2A and FIG. 8A.

Figure 2A:
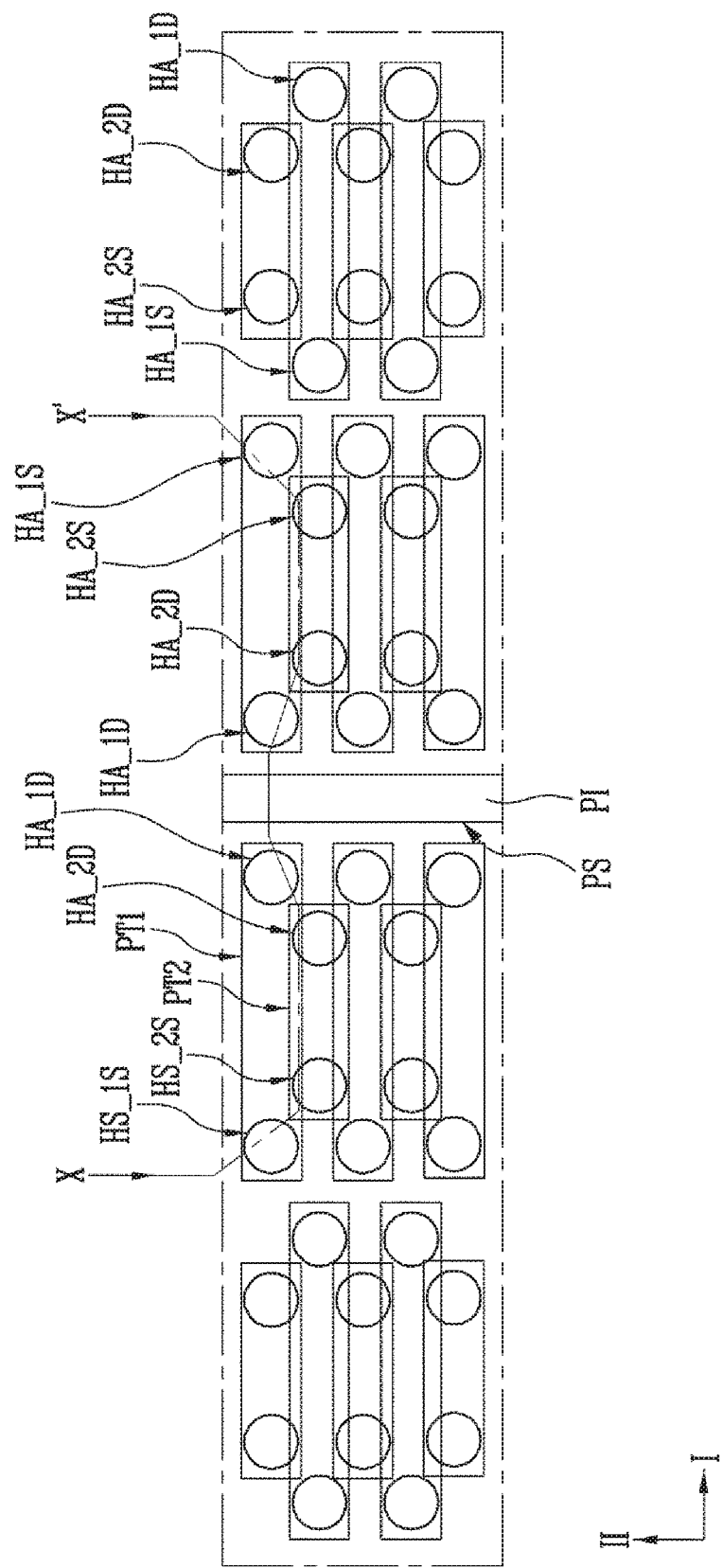
FIG. 2A to FIG. 9 are respective top and cross-sectional views illustrating a method of manufacturing the semiconductor device in accordance with an embodiment of the present disclosure.
Figure 2B:
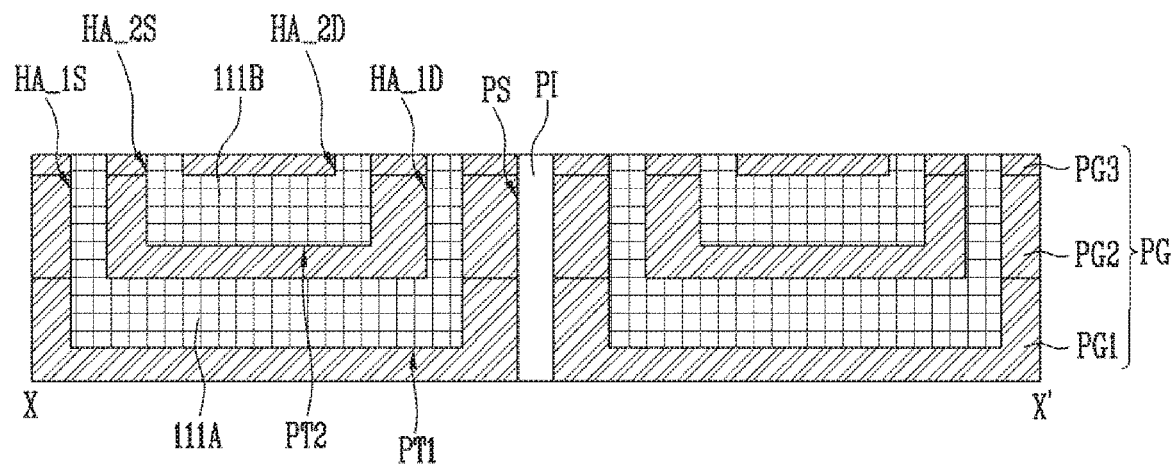

FIG. 2A and FIG. 2B are a top view and a cross-sectional view for illustrating a method of forming a pipe gate. The pipe gate includes buried sacrificial materials.

Referring to FIG. 2A and FIG. 2B, the pipe gate PG may include a stack of the first to third pipe gate films PG1 to PG3. Each of the first to third pipe gate films PG1 to PG3 may be made of a conductive material which may include silicon (Si) in one example. The pipe gate PG may be divided by the pipe division insulating film PI on the memory block basis. That is, the pipe gate PG may be divided by the PI into a plurality of sub-pipe gates each of which respectively corresponds to a unit memory block.

Within the first pipe gate film PG1, there may be formed first trenches PT1. Within the second pipe gate film PG2, there may be formed second trenches PT2. Each of the second trenches PT2 may be disposed above each of the first trenches PT1.

In each of the plurality of the sub-pipe gates respectively corresponding to the memory blocks, the first trenches PT1 and the second trenches PT2 may be arranged alternatively in the second direction II. Further, in each of the plurality of the sub-pipe gates respective corresponding to the memory blocks, the first trenches PTI and the second trenches PT2 may be arranged alternatively in the first direction I. The first direction I and the second direction IT cross each other. Each of the first trenches PT1 and the second trenches PT2 may extend in a line form in the first direction I. The second trench PT2may be stacked over the first trench PT1. Each of the second trenches PT2 may be shorter in length than each of the first trenches PT1 when measured along the first direction I.

The first trench PT1 may be connected to at least one pair of the first pipe through-holes HA_1S, HA_1D which may vertically pass through the second and third pipe gate films PG2 and PG3. The second trench PT2 may be coupled to at least one pair of the second pipe through-holes HA_1S, HA_1D which may vertically pass through the pipe gate film PG3.

The first pipe through-holes HA_1S, HA_1D may include the first source-side channel hole HA_1S and the first drain-side channel hole HA_1D. The second pipe through-holes HA_2S, HA_2D may include the second source-side channel hole HA_2S and the second drain-side channel hole HA_2D. The first source-side channel holes HA_1S may be a first single line and arranged in the second direction II. The first drain-side channel holes HA_1D may be a second single line and arranged in the second direction II. The second source-side channel holes HA_2S may be a third single line and arranged in the second direction II. The second drain-side channel holes HA_2D may be a fourth single line and arranged in the second direction II. The third and fourth lines may be disposed between the first and second lines as shown in FIG. 2A.

The first trench PT1 and the first pipe through-holes HA_1S, HA_1D may be filled with the first sacrificial pattern 111A. The second trench PT2 and the second pipe through-holes HA_2S, HA_2D may be filled with the second sacrificial pattern 111B. The first sacrificial pattern 111A and the second sacrificial pattern 111B may be formed of the same sacrificial material at the same time. In one example, the sacrificial material may include TiN.

The above partially-manufactured semiconductor device, in which the first sacrificial pattern 111A and the second sacrificial pattern 111B are formed in the pipe gate PG which is divided by the pipe division insulating film PI into the sub-pipe gate, will be manufactured in one example as follows.

First, the first pipe gate film PG1 may be partially etched away so that the first pipe gate PG1 may have the first trench PT1 formed therein. Subsequently, the first trench PT1 may be filled with a first protection film (not shown). Thereafter, on the first pipe gate film PG1, there may be formed the second pipe gate film PG2.

Next, the second pipe gate film PG2 may be partially etched away so that the second pipe gate PG2 may have the second trench PT2 formed therein. Subsequently, the second trench PT2 may be filled with a second protection film (not shown). Next, on the second pipe gate film PG2, there may be formed the third pipe gate film PG3. After this, at least one of the third pipe gate film PG3 and the second pipe gate film PG2 may be partially etched away to form the first and second pipe through-holes HA_1S, HA_1D, and HA_2S, HA_2D to partially expose the first and second protection films respectively in the first trench PT1 and the second trench PT2. Further, the first and second protection films as exposed may be removed respectively through the pipe first and second through-holes HA_1S, HA_1D, HA_2S, and HA_2D.

Then, the first and second trenches PT1 and PT2 and the first and second pipe through-holes HA_1S, HA_1D, HA_2S, and HA_2D coupled respectively to the first and second trenches PT1 and PT2 may be filled with a sacrificial material. After this, a surface of the filled sacrificial material may be smoothened to form the first sacrificial pattern 111A and the second sacrificial pattern 111B. Further, the first to third pipe gate films PG1 to PG3 may be vertically and partially etched away to form a pipe slit PS. Then, the pipe slit PS may be filled with an insulating material. A surface of the filled insulating material may be smoothened so that the pipe insulating film PI may be formed only in the pipe slit PS.

Figure 3:
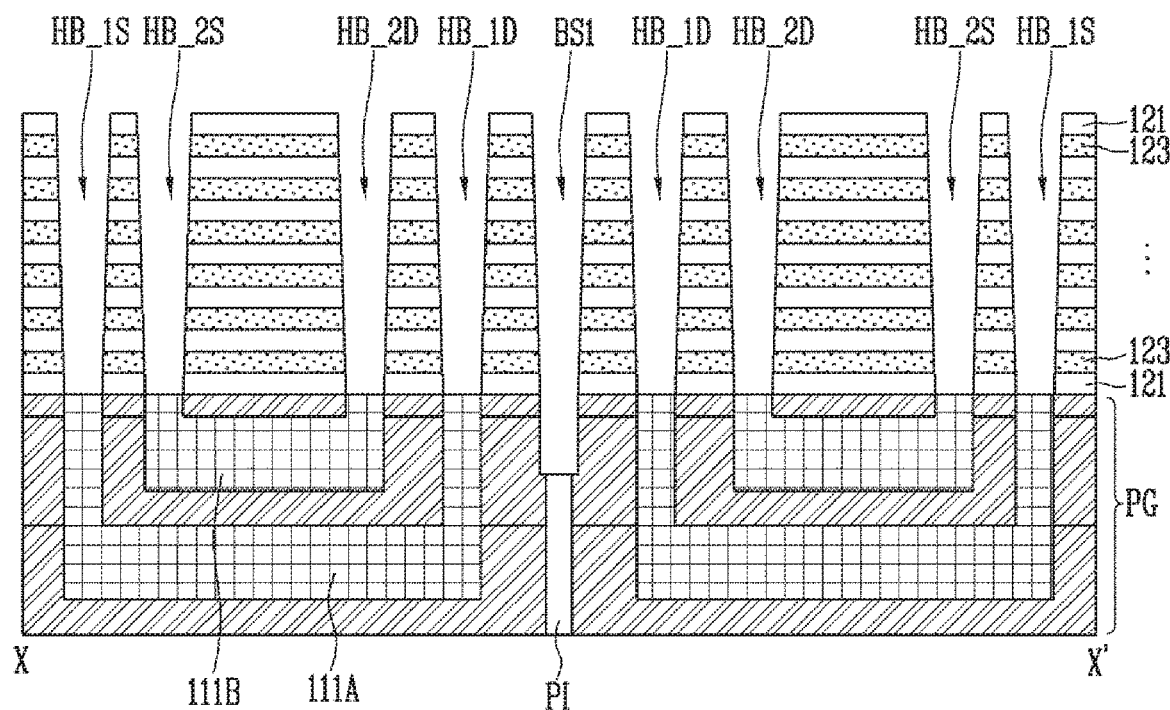

FIG. 3 is a cross-sectional view for illustrating a process of forming the first stack through which a lower block slit and lower channel holes pass. Referring to FIG. 3, on the above partially-manufactured semiconductor device, where the first sacrificial pattern 111A and the second sacrificial pattern 111B are formed in the pipe gate PG and where the pipe gate PG is divided by the pipe division insulating film PT into the sub-pipe gate, there may be formed a vertical alternation of the first material films 121 and the second material films 123. The first material films 121 may serve as or be replaced with the interlayer insulating films. The second material films 123 may serve as or be replaced with the conductive patterns.

The second material films 123 may be made of a different material from the first material films 121. In one example, the first material films 121 may be made of the same material as the interlayer insulating film, while the second material films 123 may be made of the same material as the conductive pattern.

Alternatively, the first material films 121 may be made of a first insulating material which is the same as the interlayer insulating film, while the second material films 123 may be made of a second insulating material and serve as a sacrificial film. In this case, the first and second insulating materials may have different etching selection ratios. In one example, the first material films 121 may be made of a silicon oxide film while the second material films 123 may be made of a silicon nitride film. In this way, since the first and second material films 121, 123 both may be made of the insulating materials, a process for forming the channel holes or slit may be less complicated.

Alternatively, the first material films 121 may be made of a first conductive material and serve as a sacrificial film while the second material films 123 may be made of a second conductive material which is the same as the conductive pattern. In this case, the first and second conductive materials may have different etching selection ratios. In one example, the first material films 121 may be made of an un-doped poly-silicon film while the second material films 123 may be made of a doped poly-silicon film. In this way, since the first and second material films 121, 123 both may be made of the conductive materials, more particularly, poly-silicon, a process for forming the channel holes or slit may be less complicated.

Subsequently, the first material films 121 and the second material films 123 may be partially vertically etched away to form the lower channel holes HB_1S, HB_1D, HB_2D and lower block slit BS1. The lower first channel holes HB_1S, HB_1D and the lower second channel holes HB_2S, HB_2D may vertically pass through the first material films 121 and the second material films 123, respectively, and may be coupled respectively to the first pipe through-holes HA_1S, HA_1D and the second pipe through-holes HA_2S, HA_2D.

The lower channel holes HB_1S, HB_1D, HB_2S, and HB_2D may be divided into the first source-side channel hole HB_1S, the first drain-side channel hole HB_1D, the second source-side channel hole HB_2S, and the second drain-side channel hole HB_2D. The first source-side channel hole HB_1S and the first drain-side channel hole HB_1D may partially expose the first sacrificial pattern 111A while the second source-side channel hole HB_2S and the second drain-side channel hole HB_2D may partially expose the second sacrificial pattern 111B.

The lower block slit BS1 may vertically pass through the first material films 121 and the second material films 123 so as to divide the vertical alteration of the first material films 121 and the second material films 123 on the memory block basis. The lower block slit BS1 may be designed in the same layout as the pipe division insulating film PI. The lower block slit BS1 may expose the pipe division insulating film PI.

Figure 4:
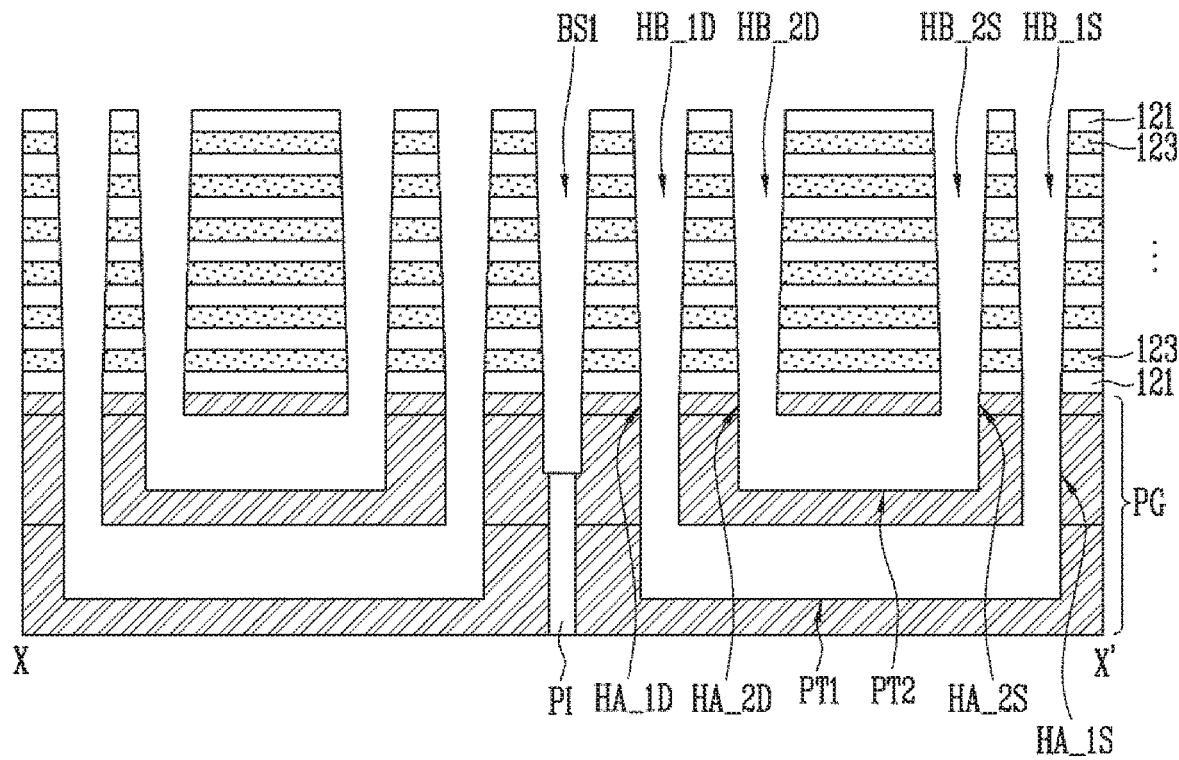

FIG. 4 is a cross-sectional view for illustrating a process of opening the first and second trenches, and pipe through-holes. Referring to FIG. 4, through the first and second lower channel holes HB_1S, HB_1D, HB_2D, the first sacrificial pattern 111A and the second sacrificial pattern 111B may be selectively etched away. In this way, the first and second pipe through-holes HA_1S, HA_1D, HA_2S, HA_2D, and the first trench PT1 and the second trench PT2 may be opened.

Although not shown in the figure, when the second material films 123 are made of a sacrificial insulating material, the side-walls of the second material films 123 may be partially oxidized through the lower first and second channel holes HB_1S, HB_1D, HB_2S, HB_2D and the lower block slit BS1. Further, along and on a side-wall of each of the opened pipe through-holes HA_1S, HA_1D, HA_2S, HA_2D, lower channel holes HB_1S, HB_1D, HB_2S, HB_2D, and the lower block slit BS1, a taper film may be formed to have a gradually decreasing width toward a bottom thereof.

Figure 5:
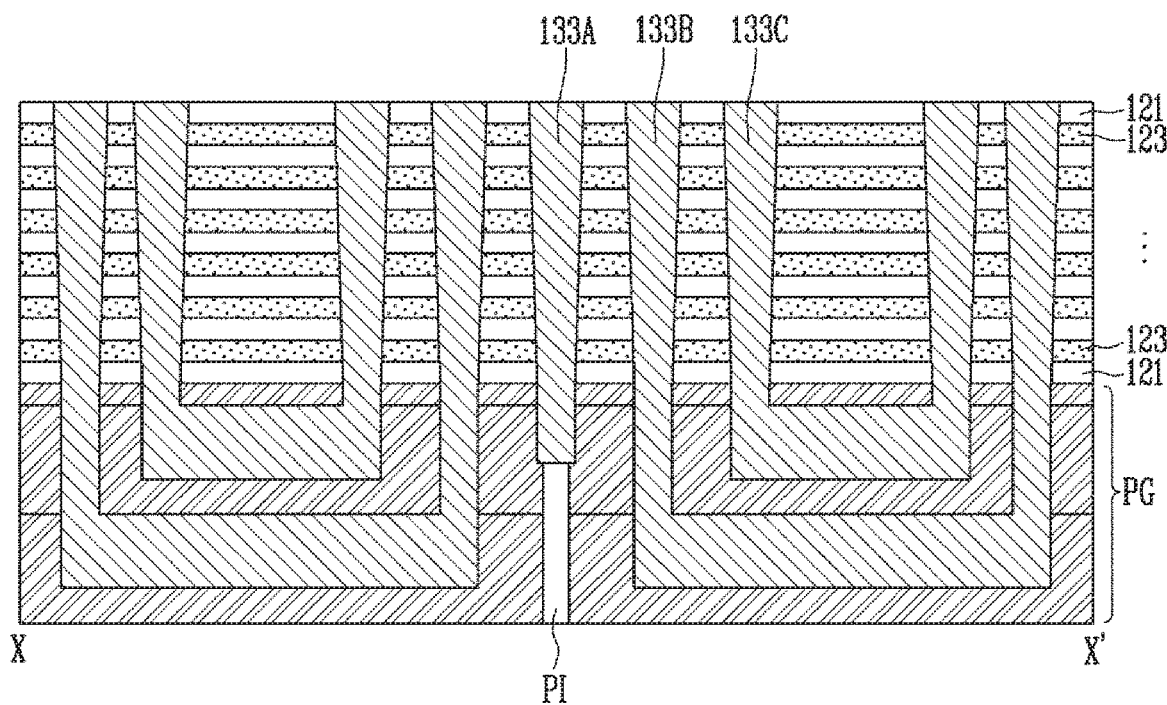

FIG. 5 is a cross-sectional view for illustrating a process of forming first and second protection patterns. Referring to FIG. 5, the lower channel holes HB_1S, HB_1D, HB_2S, HB_2D, the lower block slit BSI, the pipe through-holes HA_1S, HA_1D, HA_2S, HA_2D, the first trench PT1, and the second trench PT2 may be filled with a protection film. The protection film may have a different material from the first material films 121 and the second material films 123. In one example, the protection film may be made of a polysilicon film, titanium nitride film, tungsten film, or the like.

After this, a surface of the protection film may be planarized to expose the first stack of the first material films 121 and the second material films 123. In this way, the first protection pattern 133A and the second protection patterns 133B, 133C may be formed.

The first protection pattern 133A may fill only the lower block slit BS1. By the first protection pattern 133A, the vertical alternation of the first material films 121 and the second material films 123 may be divided on the memory block basis.

The second protection patterns 133B, 133C may be divided into the first type of the second protection pattern 133B and the second type of the second protection pattern 133C. The first type of the second protection pattern 133B may fill and extend along the first drain-side channel holes HB_1D, HA_1D, the first trench PT1, and the first source-side channel holes HA_1S, HB_1S. The second type of the second protection pattern 133C may fill and extend along the second drain-side channel holes HB_2D, HA_2D, the second trench PT2, and the second source-side channel holes HA_2S, HB_2S. Each of the second protection patterns 133B, 133C may include a horizontal portion embedded in the pipe gate PG and vertical portions respectively extending from both ends of the horizontal portion. Each of the second protection patterns 133B, 133C is surrounded with the first material films 121 and the second material films 123.

Figure 6:
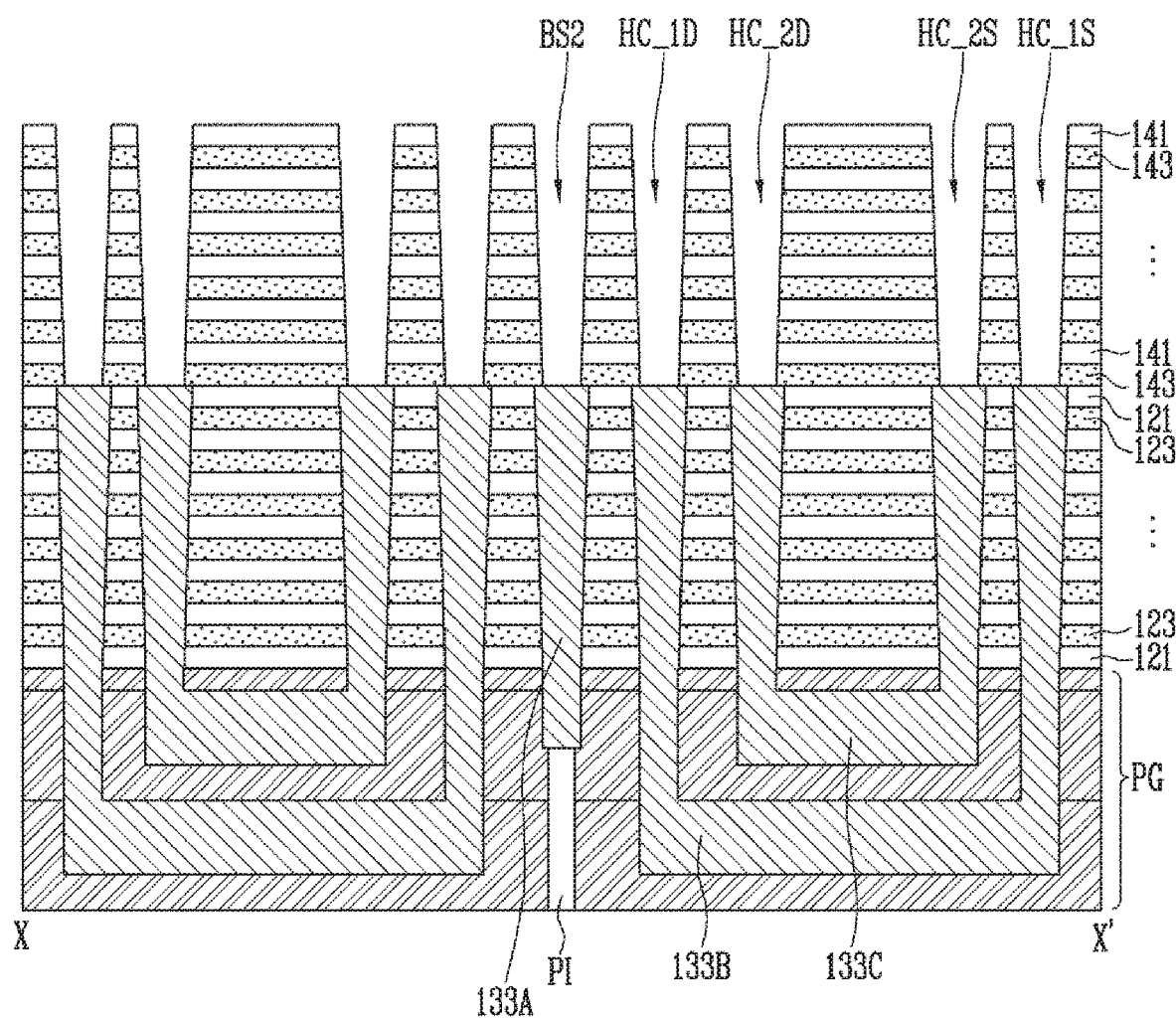

FIG. 6 is a cross-sectional view for illustrating a process of forming the second stack through which an upper block slit and upper channel holes pass. Referring to FIG. 6, on the lower vertical alternation of the first material films 121 and the second material films 123, an upper vertical alternation of the third material films 141 and fourth material films 143 is formed. The third material films 141 may serve as or be replaced with the interlayer insulating films. The fourth material films 143 may serve as or be replaced with the conductive patterns. The third material films 141 may be made of the same material as the first material films 121 while the fourth material films 143 may be made of the same material as the second material films 141.

Next, the third material films 141 and fourth material films 143 may be partially and vertically etched away to form upper first and second channel holes HC_1S, HC_1D, HC_2S, HC_2D and an upper block slit BS2.

The upper first and second channel holes HC_1S, HC_1D, and HC_2S, HC_2D may pass through the upper vertical alternation of the third material films 141 and fourth material films 143 and be coupled respectively to the lower first and second channel holes HB_1S, HB_1D and HB_2S, HB_2D. The upper channel holes HC_1S, HC_1D, HC_2S, HC_2D may be divided into the first source-side channel hole HC_1S, the first drain-side channel hole HC_1D, the second source-side channel hole HC_2S, and the second drain-side channel hole HC_2D. The first source-side channel hole HC_1S and the first drain-side channel hole HC_1D may expose the first type of the second protection pattern 133B while the second source-side channel hole HC_2S and the second drain-side channel hole HC_2D may expose the second type of the second protection pattern 133C.

The upper block slit BS2 may pass through the upper vertical alternation of the third material films 141 and fourth material films 143 so as to divide the upper vertical alternation of the third material films 141 and fourth material films 143 on the memory block basis. The upper block slit BS2 may be coupled to the lower block slit BS1 and may be designed in the same shape as the lower block slit BS1. The upper block slit BS2 may expose the first protection pattern 133A.

Figure 7A:
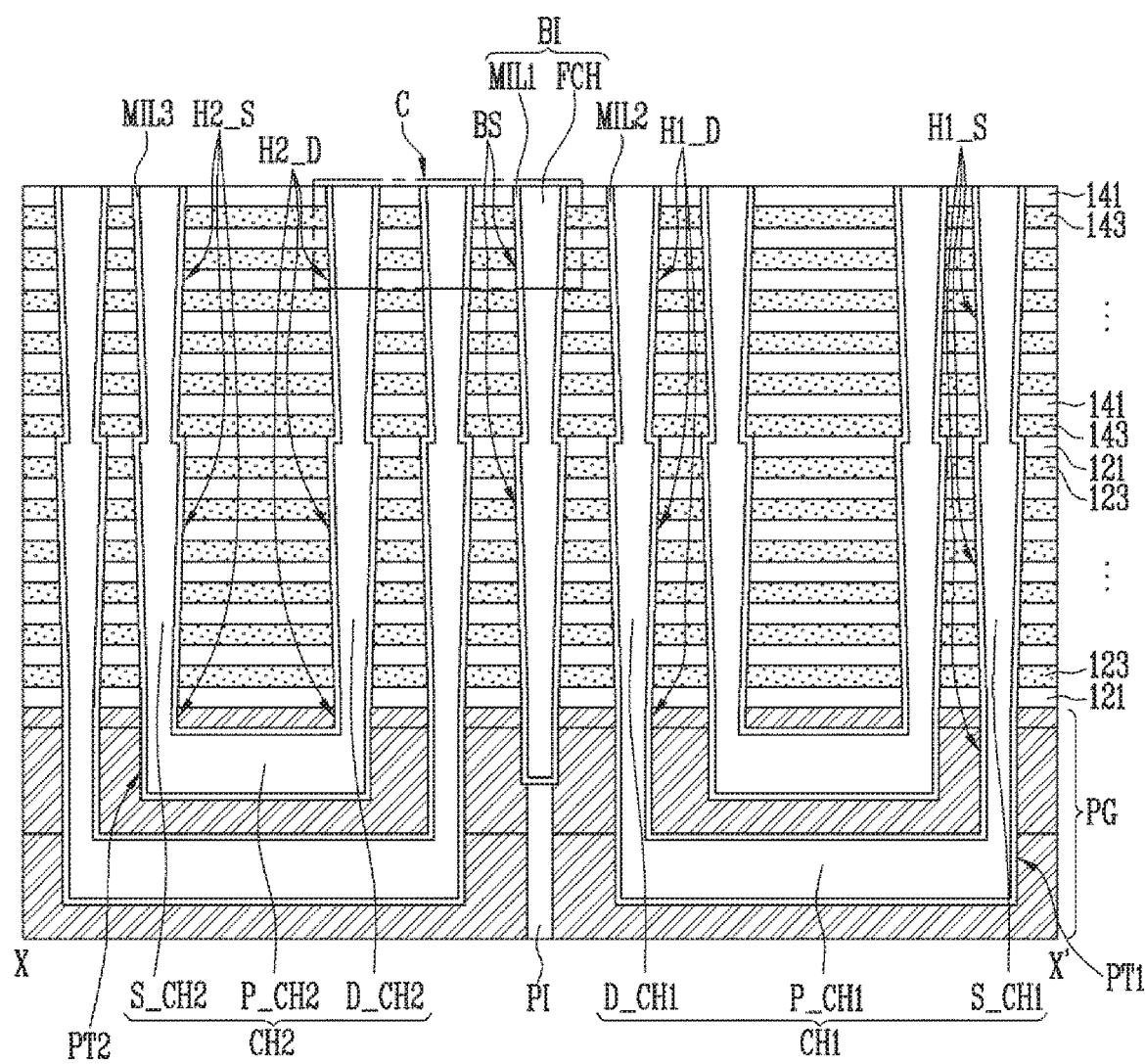
Figure 7B:
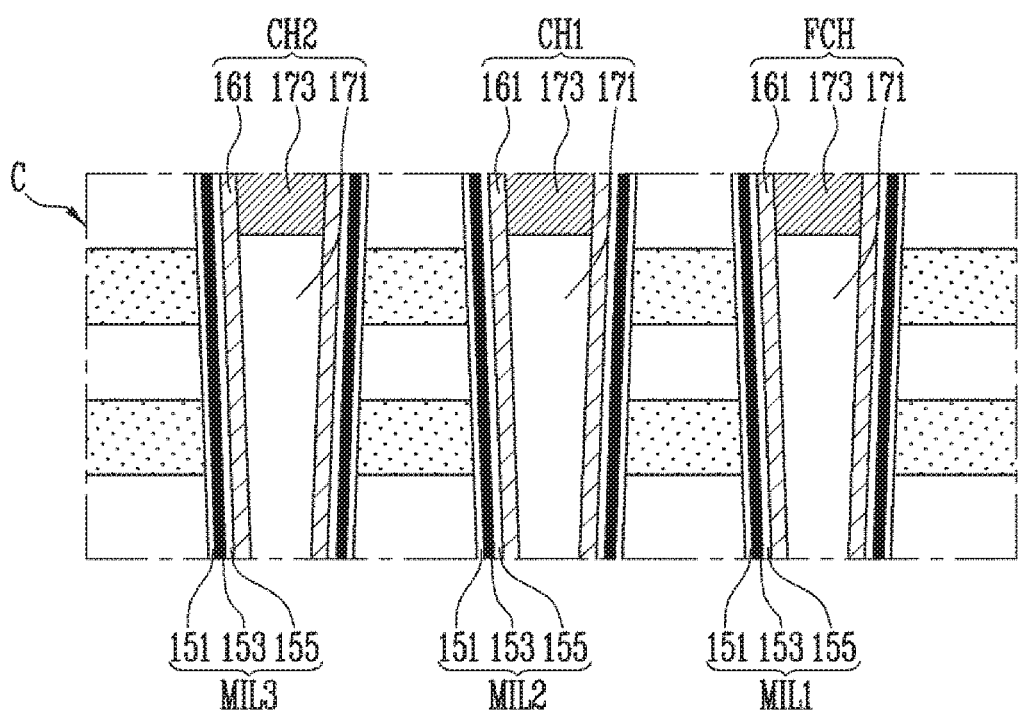

FIG. 7A and FIG. 7B are cross-sectional views for illustrating a process of forming the block separator and the channel structures. FIG. 73 is an enlarged view of the "C" region in FIG. 7A.

Referring to FIG. 7A and FIG. 7B, through the upper first and second channel holes HC_1S, HC_1D, HC_2S, HC_2D and the upper block slit BS2 as illustrated above in connection to FIG. 6, the first protection pattern 133A and the second protection patterns 133B, 133C may be selectively etched away. In this way, the lower channel holes HB_1S, HB_1D, HB_2S, HB_2D, pipe through-holes HA_1S, HA_1D, HA_2S, HA_2D, the first trench PT1, and the second trench PT2 as illustrated above in connection to FIG. 4 may be opened.

Although not shown in the figure, when the fourth material films 143 are made of a sacrificial insulating material, the side-walls of the fourth material films 143 may be partially oxidized through the upper channel holes HB_1S, HB_1D, HB_2S, HB_2D and upper block slit BS2.

Hereinafter, for the sake of convenience of illustration, the first source-side channel holes HA_1S, HB_1S, HC_1S coupled to one end of the first trench PT1 may be collectively referred to as the first source-side channel holes group H1_S. Further, the first drain-side channel holes HA_1D, HB_1D, HC_1D coupled to the other end of the first trench PT1 may be collectively referred to as the first drain-side channel holes group H1_D. The second source-side channel holes HA_2S, HB_2S, HC_2S coupled to one end of the second trench PT2 may be collectively referred to as the second source-side channel holes group H2_S. The second drain-side channel holes HA_2D, HB_2D, HC_2D coupled to the other end of the second trench PT2 may be collectively referred to the second drain-side channel holes group H2_D. The combination of the upper block slit BS2 and the lower block slit BS1 may be defined as a block slit group BS.

Further, along and on a side-wall of each of the first source-side channel holes group H1_S, the first drain-side channel holes group H1_D, the second source-side channel holes group H2_S, and the second drain-side channel holes group H2_D, and block slit group BS, a taper film may be formed which has a gradually decreasing width toward a bottom thereof.

Then, the block separator BI and channel structures CH1, CH2 may be formed at the same time. The block separator BI may be formed by filling the block slit group BS including the upper block slit BS2 and lower block slit BS1. The block separator BI may include the first multi-layered insulating film MIL1 and the floating channel structure FCH surrounded with the first multi-layered insulating film MIL1.

The channel structures CH1, CH2 may include the first channel structure CH1 and the second channel structure CH2. The first channel structure CH1 may fill and thus extend along the first source-side channel holes group H1_S, the first trench PT1 and the first drain-side channel holes group H1_D. The first channel structure CH1 may be surrounded with the second multi-layered insulating film MIL2. More specifically, the first channel structure CH1 may include each of the first source-side pillars S_CH1 filling the first source-side channel holes group the first pipe channel P_CH1 filling the first trench PT1, and each of the first drain-side pillars D_CH1 filling the first drain-side channel holes group H1_D. The second channel structure CH2 may fill and thus extend along the second source-side channel holes group H2_S, the second trench PT2, and the second drain-side channel holes group H2_D. The second channel structure CH2 may be surrounded with the third multi-layered insulating film MIL3. More specifically, the second channel structure CH2 may include each of the second source-side pillars S_CH2 filling the second source-side channel holes group H2_S, the second pipe channel P_CH2 filling the second trench PT2, and each of the second drain-side pillars D_CH2 filling the second drain-side channel holes group H2_D.

Each of the first to third multi-layered insulating films MIL1 to MIL3 may include the blocking insulating film 151, the data storage film 153, and the tunnel insulating film 155 as illustrated above in connection to FIG. 1B and FIG. 1C. Each of the floating channel structure FCH and channel structures CH1, CH2 may include the semiconductor film 161 surrounded with one of the multi-layered insulating film MIL1 to MIL3 as illustrated above in connection to FIG. 1B and FIG. 1C.

Hereinafter, one exemplary process of forming the first to third multi-layered insulating films MIL1 to MIL3, floating channel structure FCH, and channel structures CH1, CH2 may be more specifically described. First, a liner film may formed on and along each of inner sidewalls of the block slit group BS, the first source-side channel holes group H1_S, the first drain-side channel holes group H1_D, the second source-side channel holes group H2_S, the first drain-side channel holes group H2_D, the first trench PT1, and the second trench PT2. Such liner film formation may include (i) forming a blocking insulating film 151 on each of inner sidewalls of the block slit group BS, the first source-side channel holes group the first drain-side channel holes group H1_D, the second source-side channel holes group H2_S, the first drain-side channel holes group H2_D, the first trench PT1, and the second trench PT2, (ii) forming the data storage film 153 on the blocking insulating film 151, and (iii) forming the tunnel insulating film 155 on the data storage film 153. After this, the liner film may be planarized so that the liner films may be divided into the first to third multi-layered insulating films MIL1 to MIL3.

Thereafter, the semiconductor film 161 is formed on each of the inner side-walls of the first to third multi-layered insulating films MIL1 to MIL3, The semiconductor film 161 may be planarized to be divided into semiconductor film patterns respectively surrounded with the first to third multi-layered insulating films MIL1 to MIL3. The semiconductor film 161 may have a tube form. In this case, the block slit group BS, the first source-side channel holes group H1_S, the first drain-side channel holes group H1_D, the second source-side channel holes group H2_S, the first drain-side channel holes group H2_D, the first trench PT1, and the second trench PT2 each may have hollow center portions. This hollow portion of each of the block slit group BS, the first source-side channel holes group H1_S, the first drain-side channel holes group H1_D, the second source-side channel holes group H2_S, the first drain-side channel holes group H2_D, the first trench PT1, and the second trench PT2 may be filled with the core insulating film 171.

The core insulating film 171 may be planarized to form a central vertical filling of each of the channel structures CH1, CH2 and floating channel structure FCH. Thereafter, the core insulating film 171 may be etched away at a top portion thereof. In this way, the height of the core insulating film 171 may be shorter than that of the semiconductor film 161. That is, a top surface of the core insulating film 171 may be located at a lower level than a top surface of the semiconductor film 161.

By the height reduction of the core insulating film 171, top surfaces of the upper channel holes HC_1S, HC_1D, HC_2S, HC_2D and upper block slit BS2 may be exposed. In this case, the exposed or opened top portion of each of the upper channel holes HC_1S, HC_1D, HC_2S, HC_2D and the upper block slit BS2 may be completely filled with a capping conductive film 173. The capping conductive film 173 may be made of a doped poly-silicon film.

The capping conductive film 173 may be planarized to define a top portion of each of the channel structures CH1, CH2 and floating channel structure FCH. The capping conductive film 173 of each of the channel structures CH1, CH2 may serve as a junction region. The capping conductive film 173 of each of the channel structures CH1, CH2 and the floating channel structure FCH may be in a contact with the semiconductor film 161.

Figure 8B:
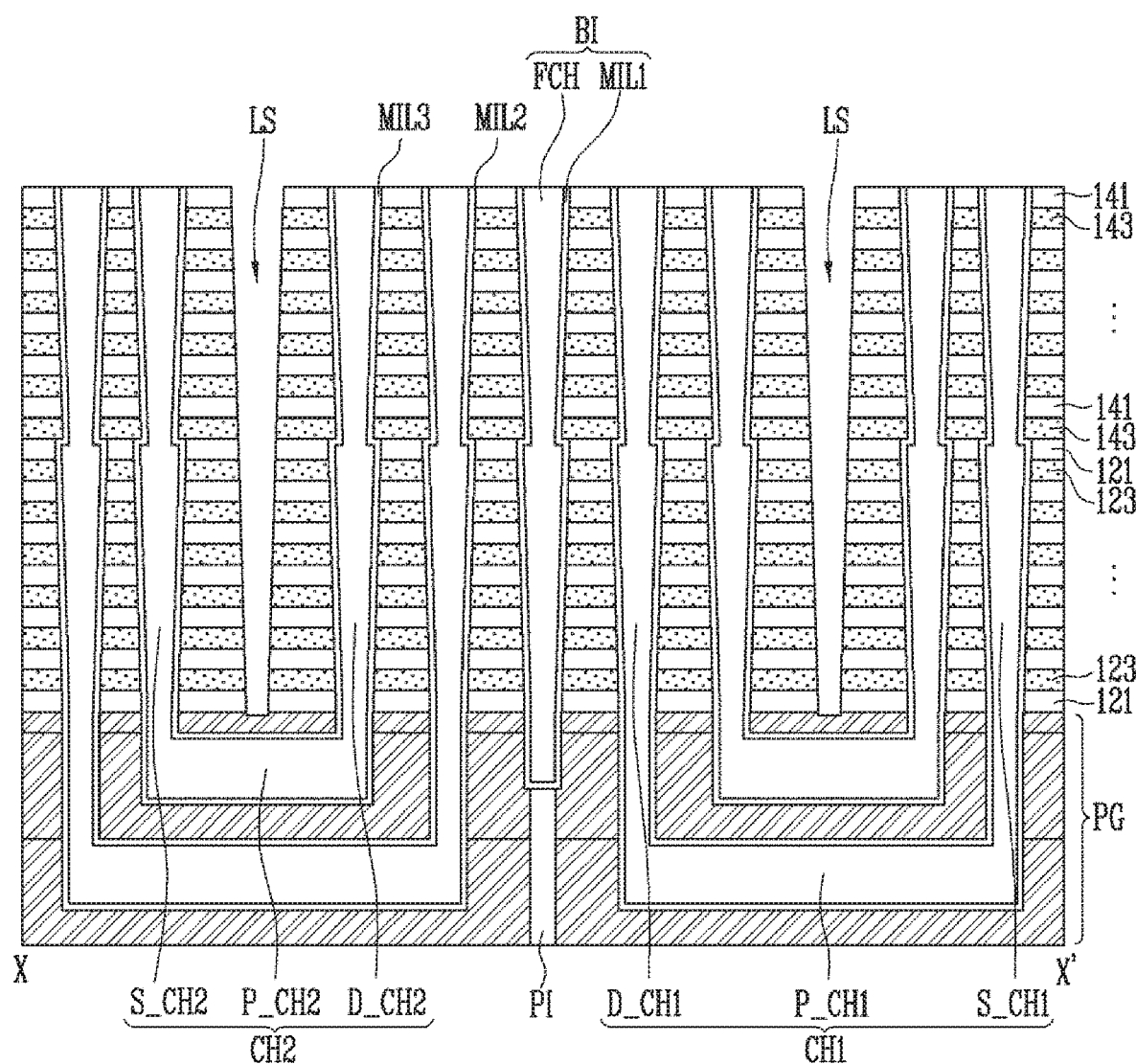

FIG. 8A and FIG. 8B are top and cross-sectional views for illustrating a process of forming a line division slit.

Referring to FIG. 8A and FIG. 8B, the line division slit LS may vertically pass through the first to fourth material films 121, 123, 141, 143. The line division slit LS may be formed by etching the first to fourth material films 121, 123, 141, 143 between the first source-side pillar S_CH1 and the first drain-side pillar D_CH1. More specifically, the line division slit LS may be formed by etching the first to fourth material films 121, 123, 141, 143 between the second source-side pillar S_CH2 and the second drain-side pillar D_CH2. A subsequent process from this point may vary depending on physical properties of the first to fourth material films 121, 123, 141, 143. This may be exemplified in connection to FIG. 9 below.

Figure 9:
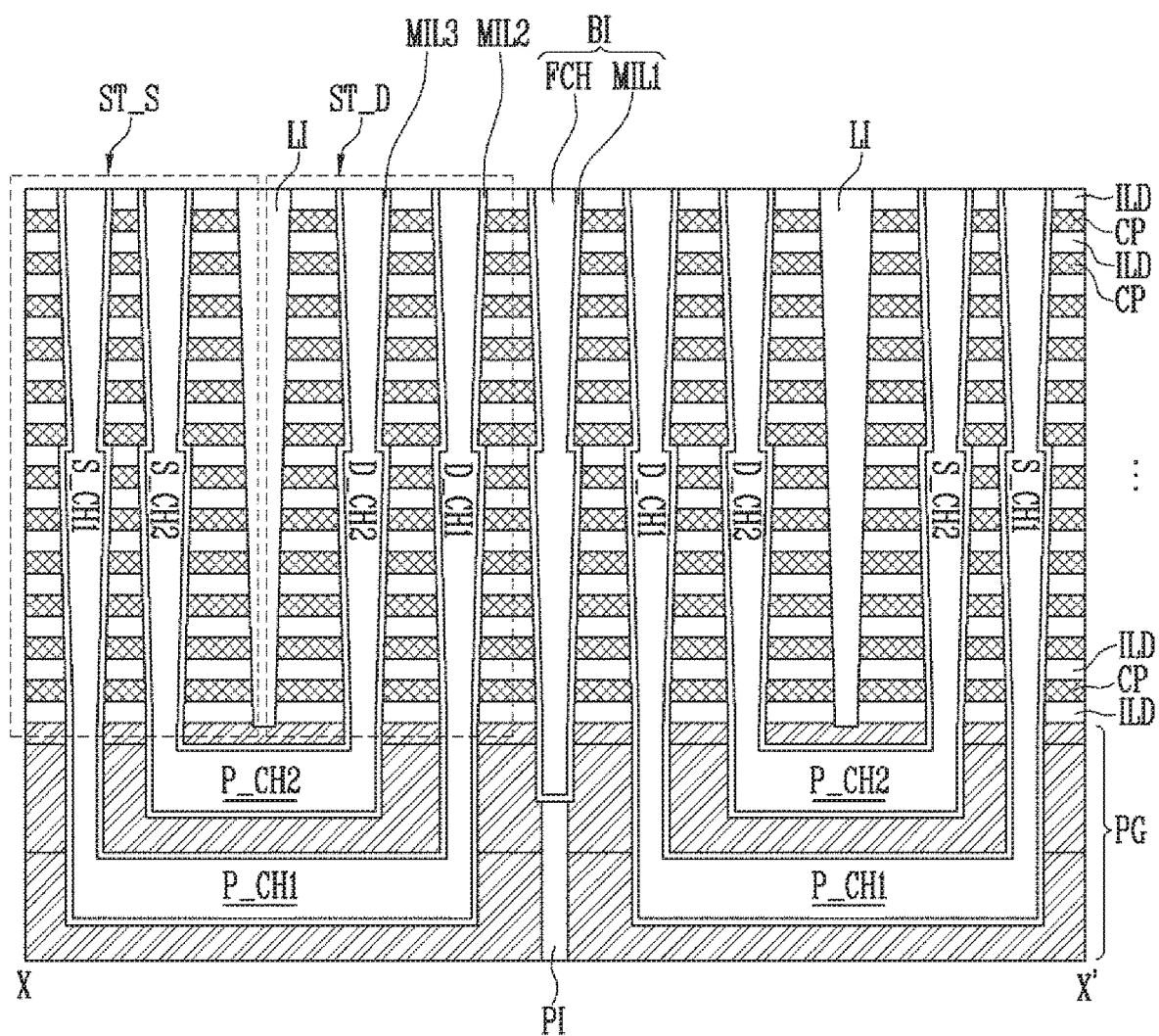

FIG. 9 is a cross-sectional view for illustrating a process of forming the interlayer insulating films and conductive patterns divided by the line division insulating film.

Referring to FIG. 9, when each of the first material films and third material films 121 and 141 are made of a interlayer insulating film, and each of the second material films and fourth material films 123 and 143 are made of a conductive material and serves as a conductive pattern, the interlayer insulating films ILD including the first material films and third material films 121 and 141 may be divided by the line division slit LS, and the conductive patterns CP including the second material films and fourth material films 123 and 143 may be divided by the line division slit LS, Next, the line division slit LS may be filled with a single insulating material to form the line division insulating film LI.

In another embodiment, when each of the first material films and third material films 121 and 141 are made of an interlayer insulating film and each of the second material films and fourth material films 123 and 143 are made of a sacrificial insulating film, the second material films and fourth material films 123 and 143 may be removed through the line division slit LS. Thereafter, the space regions, which are created upon removal of the second material films and fourth material films 123 and 143, may be filled with fifth material patterns made of conductive material. In this connection, the fifth material patterns may serve as the conductive patterns CP. Next, the line division slit LS may be filled with a single insulating material to define the line division insulating film LI.

In yet another embodiment, when each of the first material films and third material films 121 and 141 are made of a sacrificial conductive material and each of the second material films and fourth material films 123 and 143 are made of a conductive material and serve as a conductive pattern, the first material films and third material films 121 and 141 may be removed through the line division slit LS. Thereafter, the space regions, which are created upon removal of the first material films and third material films 121 and 141 and the line division slit LS, may be filled with a single insulating material to define the interlayer insulating films ILD and the line division insulating film LI.

In this way, the line division insulating film LI may divide the vertical alternation of the interlayer insulating films ILD and conductive patterns CP into the source-side stack ST_S surrounding the first and second source-side pillars S_CH1 and S_CH2 and the drain-side stack ST_D surrounding the first and second drain-side pillars D_CH1 and D_CH2.

As addressed above, in one embodiment of the present disclosure, since the channel structure and the block separator may be formed at the same time, an overlay misalignment of the channel structure and the block separator may be reduced. This makes the manufacturing process for the semiconductor device less complicated. Further, in one embodiment of the present disclosure, since the channel structure and the block separator may be formed at the same time, a process stress which otherwise may be concentrated solely on the channel structure may be distributed between the channel structure and the block separator. This makes the manufacturing process for the semiconductor device more rigid or stable.

As addressed above, in one embodiment of the present disclosure, an overall block slit formation may be divided into a first formation of a lower block slit which is vertically passing through the lower stack and a second formation of an upper block slit which is vertically passing through the upper stack. In this manner, during the block slit formation, an aspect ratio of a target pattern may be reduced and, hence, the block slit may be formed in a smaller size.

As addressed above, in one embodiment of the present disclosure, the channel hole and the block slit may be filled with the same material. Thus, a separate oxide film deposition for filling the block slit may not be necessary, and hence a simplified manufacturing process for the semiconductor device is possible. Further, a crack possibly created in the block slit due to a difference in a thermal expansion between a material filling the channel hole and another material filling the block slit may be suppressed. This crack suppression may contribute to a suppression of an oxidation of an electrical line under the stack of interlayer insulating films and conductive patterns which otherwise may be oxidized through the crack in the block slit.

Figure 10:
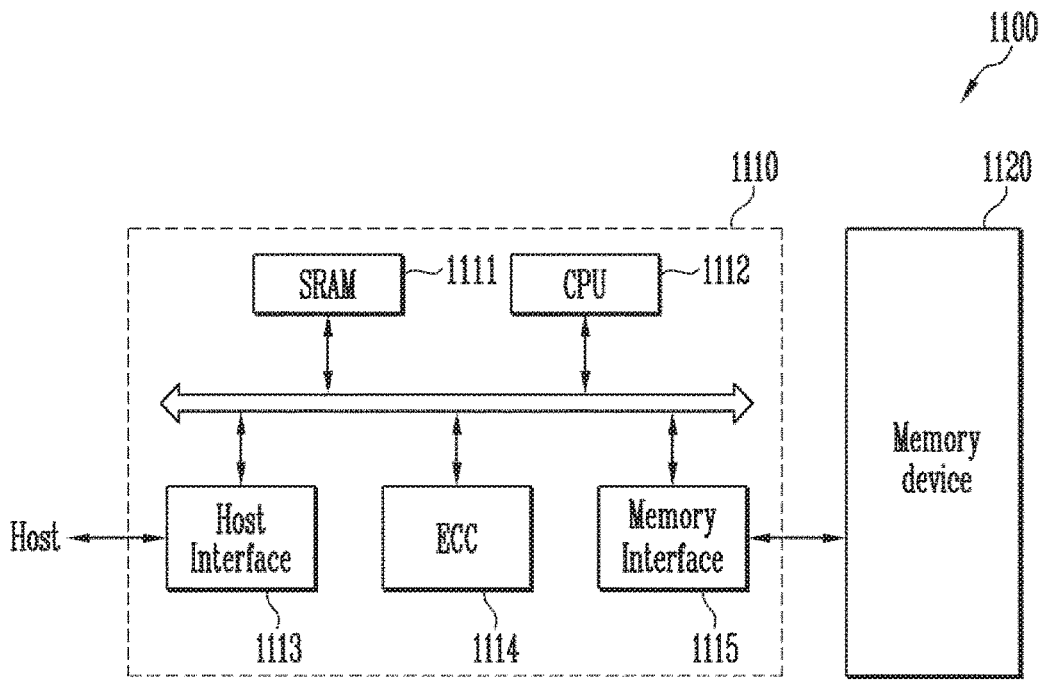
FIG. 10 illustrates a block diagram of a memory system in accordance with one embodiment.

FIG. 10 is a block diagram of a memory system in accordance with one embodiment. Referring to FIG. 10, the memory system 1100 may include the semiconductor memory device 1120 and memory controller 1110.

The semiconductor memory device 1120 may be configured as illustrated above in connection to FIG. 1A to FIG. 9. In one embodiment, the semiconductor device 1120 may comprise memory block stacks, each block stack including vertical alternations of interlayer insulating films and conductive patterns; channel structures, each channel structure vertically passing through the vertical alternations so as to electrically couple memory cells on a memory string basis, the memory cells being coupled respectively to the conductive patterns; and a block separator constructed to separate adjacent memory block stacks from each other, wherein the separator includes a multi-layered insulating film and a semiconductor film surrounded with the multi-layered insulating film. Further, the memory device 1120 may be implemented as a multi-chip package including a plurality of flash memory chips.

The memory controller 1110 may be configured to control the memory device 1120 and may include a SRAM 1111, CPU 1112, host interface 1113, ECC 1114, and memory interface 1115. The SRAM 1111 may serve as a work memory for the CPU 1112. The CPU 1112 controls all operations for data exchange of the memory controller 1110. The host interface 1113 may have a data exchange protocol between the memory system 1100 and a host system coupled to the memory system 1100. Further, the ECC 1114 may detect and correct an error in data read from the memory device 1120. The memory interface 1115 may interface the memory device 1120. In addition, the memory controller 1110 may further include a ROM to store code data to interface the host system.

The memory system 1100 may be implemented in a memory card or SSD Solid State Disk as a combination of the memory device 1120 and controller 1110. In one example, when the memory system 1100 is implemented as the SSD, the memory controller 1110 may communicate with an external device for example, a host system via various interface protocols such as USB, MMC, PCI-E, SATA, PATA, SCSI, ESDI, IDE, etc.

Figure 11:
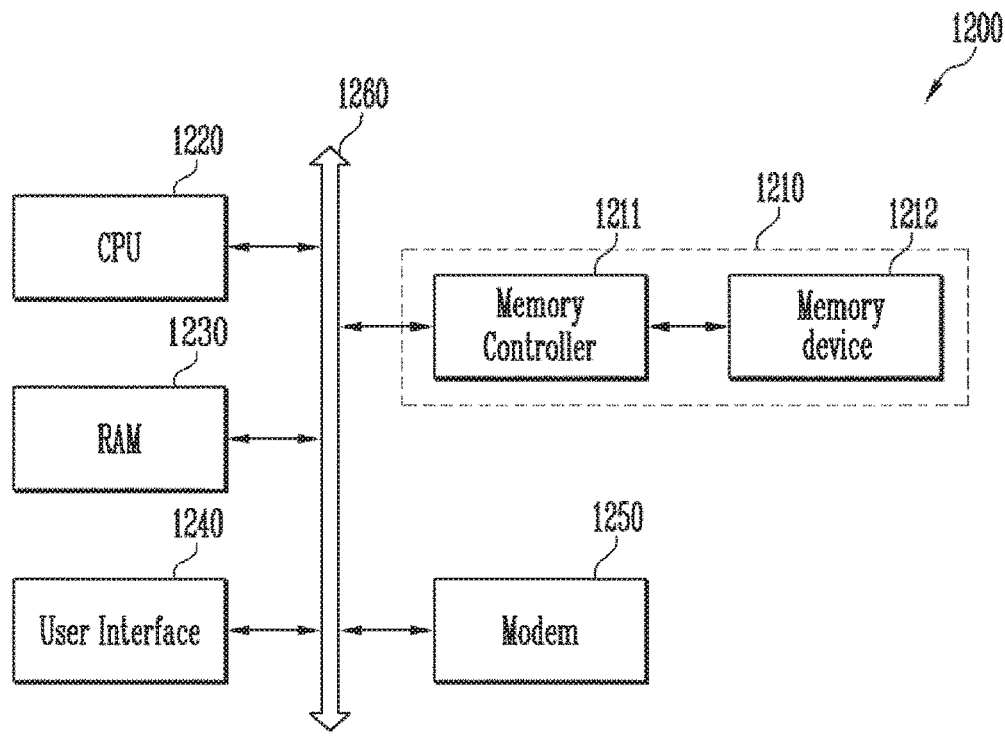
FIG. 11 illustrates a configuration diagram of a computing system in accordance with one implementation of the present disclosure.

FIG. 11 is a configuration diagram of a computing system in accordance with one implementation of the present disclosure. Referring to FIG. 11, the computing system 1200 in accordance with one implementation of the present disclosure may include a CPU 1220, RAM 1230, user interface 1240, modem 1250, and memory system 1210 which are electrically connected to each other via a system bus 1260. Further, when the computing system 1200 is implemented in a mobile device, the computing system 1200 may be further provided with a battery (not shown) to supply an operation voltage thereof and may be further provided with an application chipset, camera image processor (CIS), mobile DRAM, etc.

The memory system 1210 may include the memory device 1212, and the memory device controller 1211 as above-mentioned in FIG. 10. In one embodiment of the present disclosure, a step-by-step formation of the multiple sub-memory block stacks may result in the entire memory block. Each sub-stack formation may correspond to each sub-block slit formation. This approach may allow more rigid or stable block slit formation relative to a different approach in which all of the multiple sub-memory block stacks are formed and, then, all of the sub-stacks are etched once to form an entire block slit. As a result, the memory block stack may have an enhanced integration and may be divided in a more stable manner.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of manufacturing a semiconductor device, comprising:
    forming a first vertical stack including first material films and second material films alternately stacked in a stack direction, wherein the first vertical stack is divided by a first protection pattern into memory blocks and surrounds second protection patterns;
    forming a second vertical stack including third material films and fourth material films alternately stacked on the first vertical stack, wherein the second vertical stack is divided by an upper block slit into the memory blocks, wherein the upper block slit vertically passes through the second vertical stack to expose the first protection pattern, wherein upper channel holes pass through the second vertical stack to expose the second protection patterns;
    removing the first protection pattern and the second protection patterns through the upper block slit and the upper channel holes to form a first space and second spaces, respectively; and
    forming a semiconductor film in each of the upper channel holes, the second spaces, the upper block slit and the first space to form channel structures and a floating channel structure, the channel structures being disposed in the upper channel holes and the second spaces, the floating channel structure being disposed in the upper block slit and the first space,
    wherein a portion of the semiconductor film as the floating channel structure extends longer in a longitudinal direction crossing the stack direction than a portion of the semiconductor film as each of the channel structures, so that each of the first vertical stack and the second vertical stack is divided into the memory blocks disposed at both sides of the floating channel structure.

2. The method of claim 1, further comprising:
    forming a multi-layered insulating film over an inner sidewall of each of the upper channel holes, the upper block slit, the first space, and the second spaces.

3. The method of claim 1,
    wherein a hollow center is formed in a center of the semiconductor film, and
    wherein the method further comprises filling a core insulating film in the hollow center of the semiconductor film.

4. The method of claim 3, further comprising:
    forming a capping conductive film over the core insulating film.

5. The method of claim 1, further comprising:
    forming a line division slit passing through the first and second vertical stacks, wherein the first to fourth material films are exposed by the line division slit;
    removing the second and fourth material films through the line division slit to form third spaces and fourth spaces, respectively;
    filling fifth material patterns in the third spaces and the fourth spaces; and
    filling the line division slit with a single insulating material.

6. A method of manufacturing a semiconductor device, comprising:
    forming a pipe gate having trenches and pipe through-holes coupled to the trenches;
    filling the trenches and the pipe through-holes with a sacrificial material;
    forming a first vertical stack including first material films and second material films alternately stacked in a stack direction, wherein the first vertical stack is divided by a first protection pattern into memory blocks and surrounds second protection patterns,
    wherein the forming of the first vertical stack divided by the first protection pattern and surrounding the second protection patterns comprises:
    stacking the first material films and the second material films alternately on the pipe gate;
    forming lower channel holes and a lower block slit, wherein the lower channel holes vertically pass through the first vertical stack and are connected to the pipe through-holes, wherein the lower block slit vertically passes through the first vertical stack to divide the first vertical stack into the memory blocks;
    removing the sacrificial material through the lower channel holes to expose the pipe through-holes and the trenches; and
    forming the first protection pattern and the second protection patterns, wherein the first protection pattern fills the lower block slit,
    wherein each of the second protection patterns fills each of the lower channel holes, the pipe through-holes, and the trenches;
    forming a second vertical stack including third material films and fourth material films alternately stacked on the first vertical stack, wherein the second vertical stack is divided by an upper block slit into the memory blocks, wherein the upper block slit vertically passes through the second vertical stack to expose the first protection pattern, wherein upper channel holes pass through the second vertical stack to expose the second protection patterns;
    removing the first protection pattern and the second protection patterns through the upper block slit and the upper channel holes to form a first space and second spaces, respectively;
    filling the upper block slit and the first space to form a block separator; and
    filling the upper channel holes and the second spaces to form channel structures, wherein filling the upper block slit and the first space and filling the upper channel holes and the second spaces are performed substantially at the same time.

7. The method of claim 6,
    wherein the trenches include first and second trenches, wherein the second trench is disposed at a higher level than the first trench,
    wherein the pipe through-holes include a first pair and a second pair,
    wherein the first pair includes a first source-side channel hole and a first drain-side channel hole,
    wherein the second pair includes a second source-side channel hole and a second drain-side channel hole,
    wherein the first source-side channel hole and the first drain-side channel hole are coupled to the first trench,
    wherein the second source-side channel hole and the second drain-side channel hole are coupled to the second trench, and
    wherein both of the second source-side channel hole and the second drain-side channel hole are disposed between the first source-side channel hole and the first drain-side channel hole.

8. A method of manufacturing a semiconductor device, comprising:
- forming a vertical stack including first material films and second material films alternately stacked in a stack direction;
- forming a block slit passing through the vertical stack, wherein the vertical stack is divided by the block slit;
- forming a channel hole passing through the vertical stack; and
- forming a block separator in the block slit and a channel structure in the channel hole,
- wherein the block separator and the channel structure are formed substantially at the same time,
- wherein the block separator extends longer than the channel structure in a longitudinal direction crossing the stack direction,
- wherein the vertical stack is divided into memory blocks by the block separator comprising a floating channel structure formed of a same material as the channel structure, and
- wherein the floating channel structure of the block separator is not connected to a signal line.

9. The method of claim 8, wherein forming the block separator comprises:
- filling the block slit with a multi-layered insulating film and a semiconductor film.

10. The method of claim 9, wherein the multi-layered insulating film comprises a tunnel insulating film, a data storage film and a blocking insulating film.

11. The method of claim 8, wherein the vertical stack comprises a first vertical stack and a second vertical stack on the first vertical stack.

12. The method of claim 11, wherein forming the block slit comprises:
- forming a first protection pattern passing through the first vertical stack, wherein the first vertical stack is divided by the first protection pattern;
- forming an upper block slit to expose the first protection pattern, wherein the second vertical stack is divided by the upper block slit; and
- removing the first protection pattern.

13. The method of claim 11, wherein forming the channel hole comprises:
- forming a second protection pattern passing through the first vertical stack;
- forming an upper channel hole to expose the second protection pattern; and
- removing the second protection pattern.

14. A method of manufacturing a semiconductor device, comprising:
- forming a vertical stack including first material films and second material films alternately stacked in a stack direction;
- forming a block slit passing through the vertical stack, wherein the vertical stack is divided by the block slit;
- forming a channel hole passing through the vertical stack;
- forming a first multi-layered insulating film in the channel hole and a second multi-layered insulating film in the block slit; and
- forming a first semiconductor film in the channel hole and a second semiconductor film in the block slit,
- wherein the second semiconductor film extends longer than the first semiconductor film in a longitudinal direction crossing the stack direction,
- wherein the first semiconductor film is spaced apart from the second semiconductor film with the first material films and the second material films interposed between the first semiconductor film and the second semiconductor film, and
- wherein the second semiconductor film is not connected to a signal line.

15. The method of claim 14, wherein the first multi-layered insulating film and the second multi-layered insulating film are formed substantially at the same time.

16. The method of claim 14, wherein the second multi-layered insulating film comprises a same material as the first multi-layered insulating film.

17. The method of claim 14, wherein the second semiconductor film is electrically separated from a bit line, and the first semiconductor film is electrically connected with the bit line.

18. The method of claim 14, wherein the block slit passes through the vertical stack in a first direction and extends along a second direction crossing the first direction.

19. The method of claim 18, wherein the block slit divides the vertical stack in a third direction crossing the first and second directions.

* * * * *